United States Patent [19]
Giannetti

[11] Patent Number: 5,700,342
[45] Date of Patent: Dec. 23, 1997

[54] COMPOSITE ENCLOSURE FOR ELECTRONIC HARDWARE

[75] Inventor: William Bernard Giannetti, Fall River, Mass.

[73] Assignee: Simmonds Precision Products Inc., Richfield, Ohio

[21] Appl. No.: 469,944

[22] Filed: Jun. 6, 1995

Related U.S. Application Data

[62] Division of Ser. No. 86,273, Jun. 30, 1993, abandoned.

[51] Int. Cl.$^6$ .......................... B29C 69/00; B29C 70/00; B32B 31/18
[52] U.S. Cl. .......................... 156/245; 156/264; 156/268; 264/152; 264/258; 264/324
[58] Field of Search ................... 156/245, 264, 156/265, 257, 258, 268; 264/258, 320, 324, DIG. 53, 152; 174/52.4; 361/746, 784, 800, 805, 816

[56] References Cited

U.S. PATENT DOCUMENTS

| | | |
|---|---|---|
| H526 | 9/1988 | Miller . |
| 3,219,747 | 11/1965 | McAdams . |
| 3,992,653 | 11/1976 | Richardson et al. . |
| 4,004,194 | 1/1977 | Doerflinger et al. . |

(List continued on next page.)

FOREIGN PATENT DOCUMENTS 2042809 9/1980 United Kingdom .

OTHER PUBLICATIONS

Donegan, Therman Connection for Circuit Package, IBM Technical Disclosure Bulletin, vol. 13, No. 7, Dec. 1970.
Camloc Products Division, P.C. Board Fasteners, Selector Guide, Camloc Fastener Technology Sets New Standards for P.C. Board Access, pp. E–1–E–3.

Glatz et al. Application of Advanced Composites in Sem–E Heatsinks for the Thermal Management of Avionics. 5th International SAMPE Electronics Conference, Jun. 18–20, 1991, pp. 451–467.

Runnacles et al. Heat Treatment of Mesophase Pitch Based Low/Intermediate Modulus Fibers for C–C Applications, pp. 33–53 (1992).

Morgan, Applications of Composite Materials Systems to Avionic Systems Packaging, (1991).

Riley, Composite Heat Transfer Materials for Electronic Packaging in Future Dod Systems, pp. 2–M–1–2–M–14, (1991).

Riley/Kesapradist, Advanced Composites Tailored For Use In Electronic Packaging, Conference date Feb. 3, 1992, (1992).

Glatz et al. Application of Resin and Metal Matrix Composites to Advanced Avionics Enclosure, 5th International SAMPE Electronics Conference, Jun. 18–20, 1991, pp. 434–450.

JP 61–029161, Patent Abstract of Japan. "Thermal Conductive Cooling Module Device", Feb., 1986.

JP 62–029151, Patent Abstract of Japan, "Cooling Module For Semiconductor Device", Feb., 1987.

European Search Report for EP 94 30 4799 mailed May 29, 1995.

*Primary Examiner*—Richard Crispino
*Attorney, Agent, or Firm*—Leonard L. Lewis; Richard A. Romanchik

[57] ABSTRACT

An enclosure for electronic modules, comprising walls made of composite material including conductive fibers for shielding the enclosure interior from electromagnetic radiation, and means for securely mounting at least one module inside the enclosure with a fastener means, the mounting means comprising composite material.

8 Claims, 6 Drawing Sheets

U.S. PATENT DOCUMENTS

| | | |
|---|---|---|
| 4,227,037 | 10/1980 | Layton . |
| 4,316,925 | 2/1982 | Delmonte . |
| 4,356,228 | 10/1982 | Kobayashi et al. . |
| 4,486,494 | 12/1984 | Eldin . |
| 4,496,621 | 1/1985 | Hubert et al. . |
| 4,530,949 | 7/1985 | Atkinson et al. . |
| 4,608,453 | 8/1986 | Freman . |
| 4,664,971 | 5/1987 | Soens . |
| 4,731,698 | 3/1988 | Millot et al. . |
| 4,775,260 | 10/1988 | Kecmer . |
| 4,785,136 | 11/1988 | Mollet et al. . |
| 4,791,236 | 12/1988 | Klein et al. . |
| 4,861,649 | 8/1989 | Browne ................... 428/240 |
| 4,961,990 | 10/1990 | Yamada et al. . |
| 5,016,141 | 5/1991 | Lorig et al. . |
| 5,035,942 | 7/1991 | Nagata et al. . |
| 5,115,104 | 5/1992 | Bunyan . |
| 5,118,560 | 6/1992 | Tredway . |
| 5,136,119 | 8/1992 | Leyland . |
| 5,137,594 | 8/1992 | Asada et al. . |
| 5,217,770 | 6/1993 | Morris, Jr. et al. . |

ROTATE

BOND AND CURE ed on composite materials and that provide
COMPOSITE ENCLOSURE FOR ELECTRONIC HARDWARE This is a division of application Ser. No. 08/086,273 filed Jun. 30, 1993, now abandoned.

BACKGROUND OF THE INVENTION

The invention relates generally to enclosures for electronic hardware. More particularly, the invention relates to enclosures made of composite materials and that provide electromagnetic shielding for electronic hardware installed in such enclosures.

As is well known, electronic equipment and hardware is susceptible to electromagnetic interference (EMI), whether it be generated from radio waves, interference from nearby equipment, meteorological disturbances and so forth. In applications such as avionics, both military and commercial, such interference can present an unacceptable risk to proper operation of the hardware. Therefore, enclosures for sensitive hardware usually provide for EMI shielding, and in fact such shielding is often necessitated by military and commercial specifications.

Although enclosures made of metal such as aluminum provide good shielding against EMI, such materials add significantly to the weight of the equipment. Composite materials hold great promise for replacing heavier metal materials for enclosures with lightweight but comparably strong materials. Shielding with such composite materials can be accomplished by the use of conductive fibers in the composite material used to form the walls of the enclosure.

Although the general concept of using composite materials for shielded enclosures is well known, their use to date has been limited because of some associated problems. Although composite materials can exhibit excellent structural characteristics, in order to achieve sufficient strength, stiffness and vibrational requirements a trade off is made as to weight. In other words, the weight savings is not necessarily as great as expected due to the need for additional material in order to meet structural integrity requirements. Composite materials that meet the structural requirements also tend to be very expensive, thus substantially increasing the cost of enclosures made of such materials beyond the cost of conventional metal enclosures.

Most enclosures for electronics hardware include a card guide and heat exchanger mounted therein. The card guide, of course, is used to hold one or more electronics modules, and typically includes a plurality of guide ribs that support the modules, and a cold wall that the ribs are attached to. An electronic module typically includes one or more printed circuit boards mounted on a thermally conductive substrate (thermal plane) such as a flat metal sheet or plate. The module is held in the card guide by a suitable clamping device that clamps or wedges the module against one or more of the ribs.

Because a shielded enclosure is tightly sealed from the external environment, heat dissipated from the electronic components must be extracted from the enclosure. Typically, this is accomplished by the card guide, which is metal, and the heat exchanger. Heat is transferred from the circuit boards, through the thermal plane and clamping device to the card guide. The heat exchanger is usually in good thermal contact with the card guide and draws the heat therefrom and transfers it to actively cooled heat transfer fins, and thereafter to the outside region of the enclosure.

Although metal card guides provide good thermal dissipation, their thermal characteristics are not expected to be adequate for future specifications that will require higher heat dissipation in ever smaller enclosures. Electronics manufacturers continually improve their ability to miniaturize and densely pack electronic components into smaller envelopes, thus constantly pushing the performance requirements for dissipating heat from the enclosures. Metal card guides and enclosures will likely not meet these requirements in the future, and in any event will always have an undesirable weight factor, even when the basic enclosure walls are made of composite material.

The need exists, therefore, for a shielded enclosure that exhibits as good as or better structural performance as a conventional enclosure, and that exhibits substantially improved thermal transfer characteristics, while at the same time maintaining weight and cost advantages over known shielded enclosures.

SUMMARY OF THE INVENTION

The present invention contemplates a significant departure from known shielded enclosure designs by providing an enclosure for electronic modules, comprising walls made of composite material including conductive fibers for shielding the enclosure interior from electromagnetic radiation, and means for securely mounting at least one module inside the enclosure with a fastener means, the mounting means comprising composite material.

The present invention further contemplates methods for making shielded enclosures and card guides for such enclosures that represent a significant improvement over known enclosure designs.

These and other aspects and advantages of the present invention will be readily understood and appreciated by those skilled in the art from the following detailed description of the preferred embodiments with the best mode contemplated for practicing the invention in view of the accompanying drawings.

DETAILED DESCRIPTION OF THE INVENTION

With reference to the drawings, the present invention will be described herein as embodied in the form of a shielded enclosure for electronic hardware or modules, such as, for example, standard electronics modules used in commercial and military avionics. This description, however, is but one example of many types of enclosures and uses of such enclosures that embody the concepts of the invention and should not be construed in a limiting sense. The improvements and advantages of the invention can be realized through many different configurations and applications of enclosures for use with electronic hardware.

Figure 1:
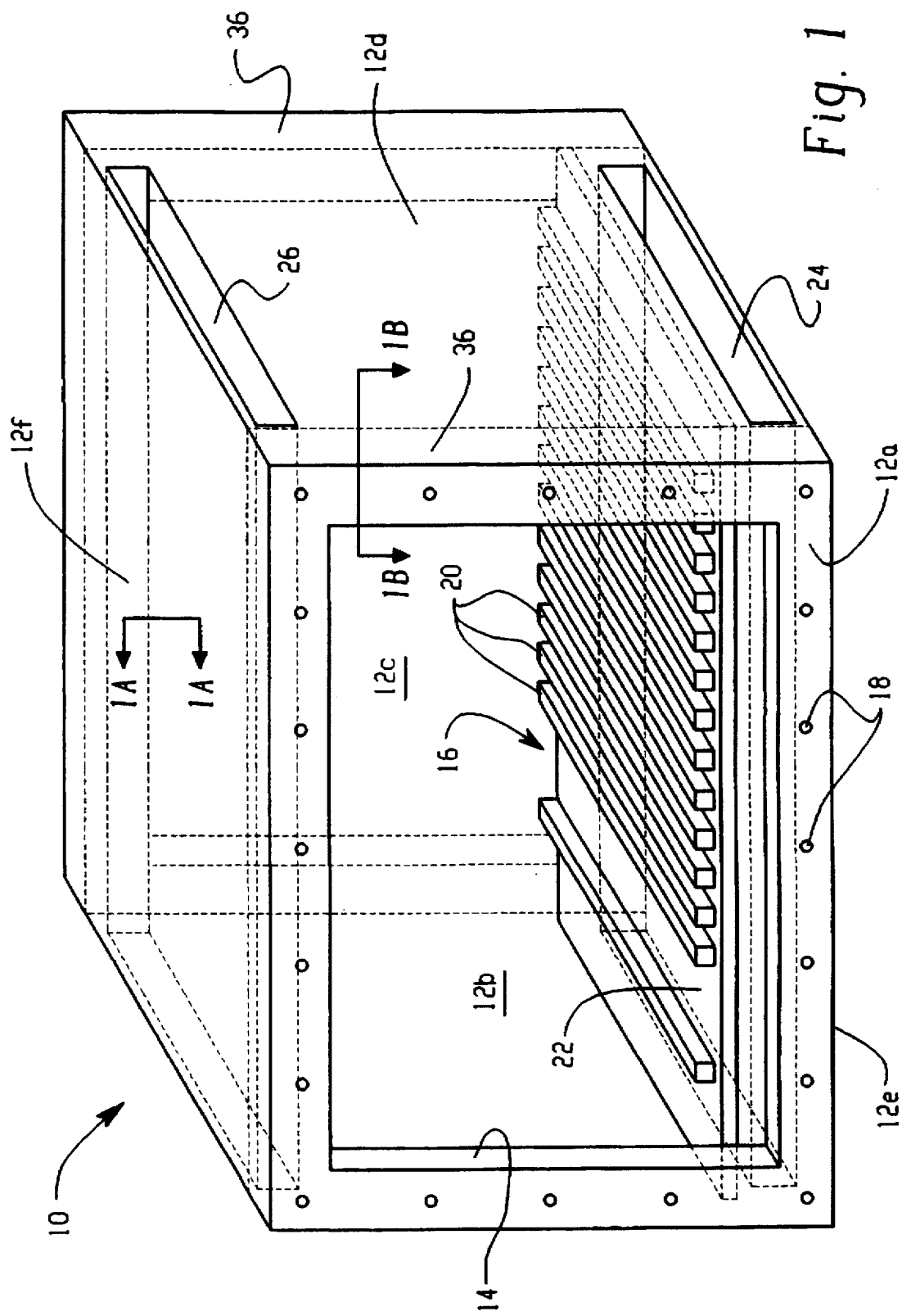
FIG. 1 illustrates in perspective a simplified schematic of a shielded enclosure according to the present invention.

A shielded enclosure 10 that embodies the concepts of the invention is illustrated in FIG. 1. The enclosure is defined by a plurality of walls 12, including side walls 12a–12d, a bottom wall 12e and a top wall 12f. At least one of the walls, in this case the front wall 12a, is provided with an access opening 14 through which one or more electronic modules (not shown) can be installed in a card guide 16. As will be explained in greater detail with respect to FIG. 6, a cover or door (not shown) is used to close the access opening 14. The door can be attached to the wall 12a with fasteners that thread into holes 18. An access opening in the rear wall 12c or other walls can also be provided if desired.

The card guide 16 actually consists of substantially identical top and bottom guides, but for clarity only the bottom guide is shown in FIG. 1 (the top guide would be attached to the top wall 12f.) The guide 16 includes a plurality of generally parallel guide ribs 20 that are integral with or securely attached to a cold wall 22. Below the cold wall is a plenum 24 that receives a heat exchanger such as a series of cooling fins that are attached to the cold wall. Air or other cooling medium is forced through the plenum 24 over the heat exchanger to extract heat therefrom. The top wall 12f is also provided with a plenum 26 that receives a second heat exchanger that is attached to the cold wall of the top card guide (not shown.)

In a conventional enclosure, the cold wall and guide ribs are made of isotropic metal, such as aluminum, with good thermal conductivity to the heat exchanger. According to an important aspect of the present invention, the card guide 16, including the guide ribs and cold wall 22 are formed of composite material, in this case preferably a carbon resin material. The composite material exhibits better thermal conductivity (watts/meterxK) than isotropic metal, but this thermal conductivity has a preferred direction that is in the direction of the fibers embedded in the composite material.

Figure 1A:
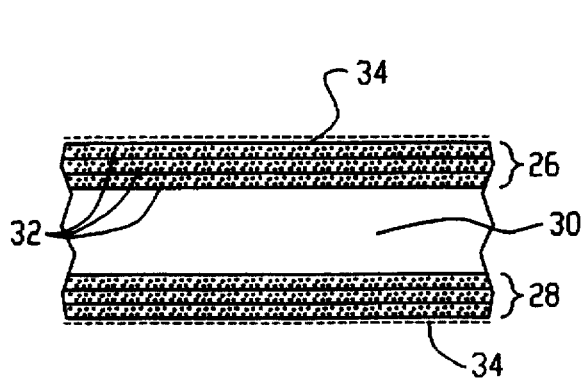
FIG. 1A shows an enlarged view in cross-section of a wall construction used with the enclosure depicted in FIG. 1.

With reference to FIG. 1A, the walls of the enclosure 10 are formed in a multiple layer arrangement in which there are first and second graphite resin skins 26, 28 with a core sandwiched therebetween. In the embodiment described herein, the skins 26, 28 are formed of a plurality of stacked laminates 32. Each laminate 32 is a low cost intermediate modulus graphite fiber impregnated with resin, such as a Fiberite™ graphite/epoxy prepreg available from ICI, that includes fibers available from Hercules Corporation. A graphite/epoxy prepreg is only one example, of course. The invention can be used with many different thermoset and thermoplastic resin materials, as well as different types of fiber materials. In this case, for example, each composite laminate can be made from a low cost graphite/epoxy prepreg, syntactic or non-structural foams. The core is made, for example, from a glass bead epoxy syntactic, such as, for example, 3M Scotch-Core™. The use of the core provides increased stiffness for the wall with minimal increase in the overall weight. The glass bead epoxy core also provides an impedance mismatch that improves the EMI shielding of the walls.

As shown in FIG. 1A, the outer surfaces of the graphite resin skins include a layer 34 of conductive fibers. These fibers are co-consolidated with the epoxy of the laminates 32, and provide the primary EMI shielding for the enclosure 10.

Figure 1B:
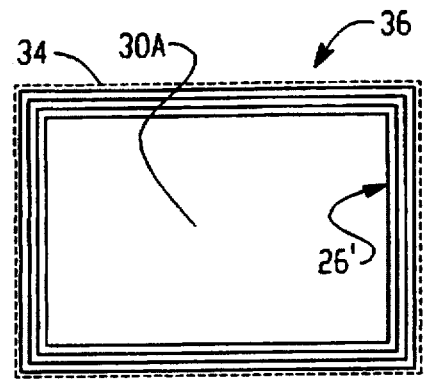
FIG. 1B shows an enlarged view, in cross-section, of a stiffening member that may be used with the enclosure of FIG. 1.

According to an important aspect of the invention, the enclosure is preferably a unibody construction except for the access opening covers. By using a unibody construction, seal joints at the corners of the enclosure can be eliminated, thus substantially improving the structural strength of the enclosure as well as improving the EMI shielding by minimizing the number of apertures. In order to make a unibody enclosure, of course, the composite material will be laid up in a suitable mold, such as, for example, as used in an autoclave molding process. In order to be able to remove the enclosure from the mold after cure, one of the walls 12 is molded without any flanges, lips or stiffening members so that the molding elements can be removed after cure. If desired, a pair of stiffening members 36 may be attached to the unibody enclosure on preferably only a single wall in order to complete and strengthen the enclosure. Other stiffening members used in the enclosure can be integrally formed with the walls during the molding process. As shown in FIG. 1B, the stiffening members are made of an ultra light weight closed cell foam core, such as Divinycell™ and include a multiple laminate skin 26' that encloses the core material 30A.

The composite walls 12 can be made up by the following process. An autoclave mold is made in a conventional manner with the desired configuration for the enclosure 10. A layer of woven conductive carbon fiber is placed in the mold first, then a series of carbon/epoxy laminates are placed in the mold, followed by the uncured core material. Then another series of laminates are placed over the core, and if desired another layer of conductive fibers. A single cure can then be performed so that the conductive layers, laminates and core are co-consolidated to form the enclosure walls in a unibody configuration.

Figure 2:
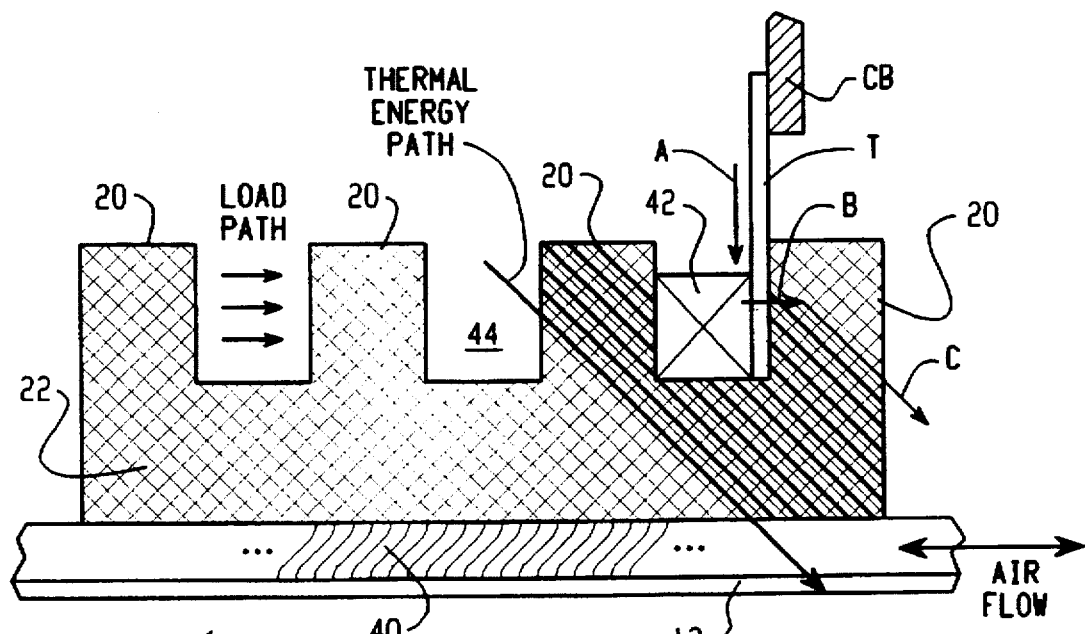
FIG. 2 is an end view in elevation of a card guide suitable for use with the invention, shown in a representative manner an electronic module secured therein with a clamping mechanism.

FIG. 2 shows a more complete view of the card guide as it can typically be used to hold electronic modules inside the enclosure 10. As described hereinbefore, the card guide includes a series of guide ribs 20 integrally formed with a cold wall 22. A heat exchanger 40, such as a series of cooling fins is attached to the outside surface of the cold wall 22 in the plenum 24 formed in or by a wall 12 of the enclosure 10. A circuit board CB with electronic components thereon (not shown), is mounted on a thermal plane T. A clamping device 42, such as, for example, a wedging device as described in U.S. Pat. No. 4,775,260 issued to Kecmer, is used to securely hold the thermal plane, in the channel 44 defined by adjacent ribs 20, up against one of the ribs. As represented by the arrows A, B and C in FIG. 2, in accordance with an important aspect of the present invention, the card guide is arranged in such a manner that the preferred direction of heat flow through the composite material of the card guide, and particularly through the ribs and cold wall, facilitates the transfer of heat from the thermal plane to the heat exchanger. This can be accomplished by using laminated structures for the ribs and cold wall wherein the fiber orientation, for example, is a cross-ply pattern as shown in FIG. 2 so that preferred direction of heat flow exists with respect to the plane that the thermal plane lies in. This promotes the transfer of heat towards the cold wall and heat exchanger without sacrificing structural performance. By providing a preferred direction for heat flow to the heat exchanger, the composite card guide exhibits a substantially increased heat transfer capacity compared to a conventional metal card guide. Depending on the type of clamping device 42 used, heat transfer can also occur through the clamping device to the cold wall 22.

Figure 3A:
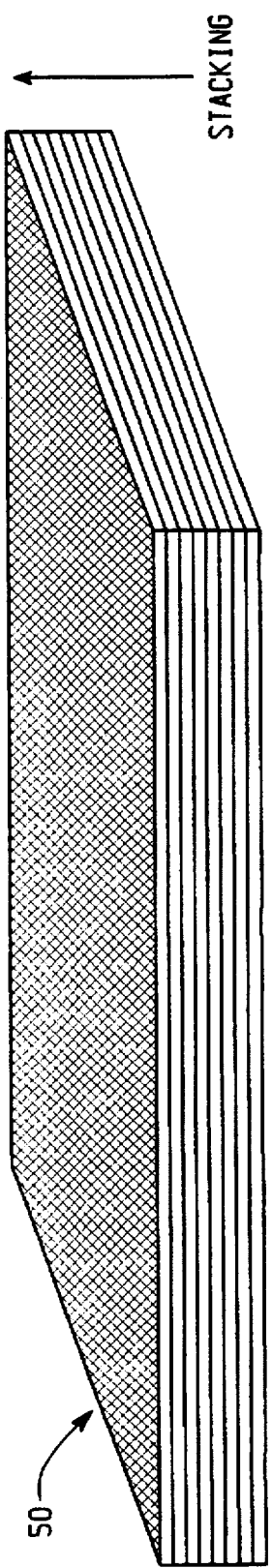
FIGS. 3A through 3E illustrate part of a method for making a composite card guide according to the present invention.

With reference to FIGS. 3A through 3E, the composite card guide 16, including the guide ribs 20 and the cold wall 22, can be formed by a method of building up layers of carbon resin laminates and arranging them in a desired manner for optimal heat flow. To obtain maximum performance from the fiber, a higher ratio of fibers is preferred (e.g., 2:1, 3:1) in the direction of the thermal plane, T, as partially depicted in FIG. 2 for clarity. FIGS. 3A-3E show one method while FIG. 4 shows another, but these are but two examples and should not be construed in a limiting sense. The particular method selected for a particular application will depend on the types of materials used, the flow direction needed to the heat exchanger and other factors such as cost constraints and so on.

In accordance with an important aspect of the present invention, first, carbon fibers are woven into a fabric having, for example, an unbalanced (2:1, 3:1) pattern with respect to the horizontal direction of the laminates as the laminates are stacked. The graphite fibers can be a low thermal conductivity graphite fiber such as woven mesophase pitch based yarn available from Amoco. This fiber material is a high modulus and strength fiber that is thus easy to weave and braid into a desired fabric orientation, but the thermal conductivity of the fibers is relatively poor due to graphite molecular alignment. After the fibers are woven into a fabric, the fabric is heat treated in accordance with the manufacturer's specifications. This heat treatment causes a dramatic increase in the thermal conductivity of the fibers, due in part to the fact that the heat treatment can cause higher molecular order. Therefore, what is left is a woven fabric that has excellent heat transfer capabilities. This initial process is very cost effective because the low grade graphite fiber is relatively inexpensive compared to high thermal conductivity fiber material. Moreover, the more expensive fiber material is more difficult to weave due to its stiffness.

An uncured resin layer, which may be, for example, a resin such as used for the enclosure walls 12 previously described herein, is then applied to the woven fabric such as with a hand layup method to form a prepreg. The resin layer impregnates the fabric before or during the curing step in which heat and pressure are applied to the composite material. Several of these laminate layers are stacked as shown in FIG. 3A by hand layup to form a block of material 50. Note that in this case the cross-ply fiber arrangement lies in horizontal planes parallel with the laminate stack.

Figure 3B:
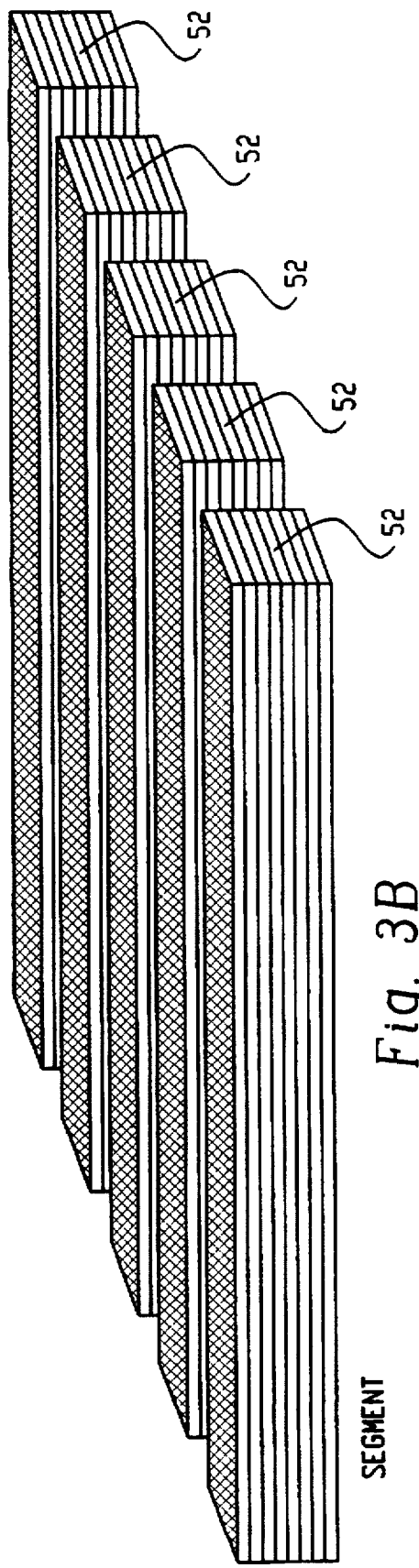
Figure 3C:
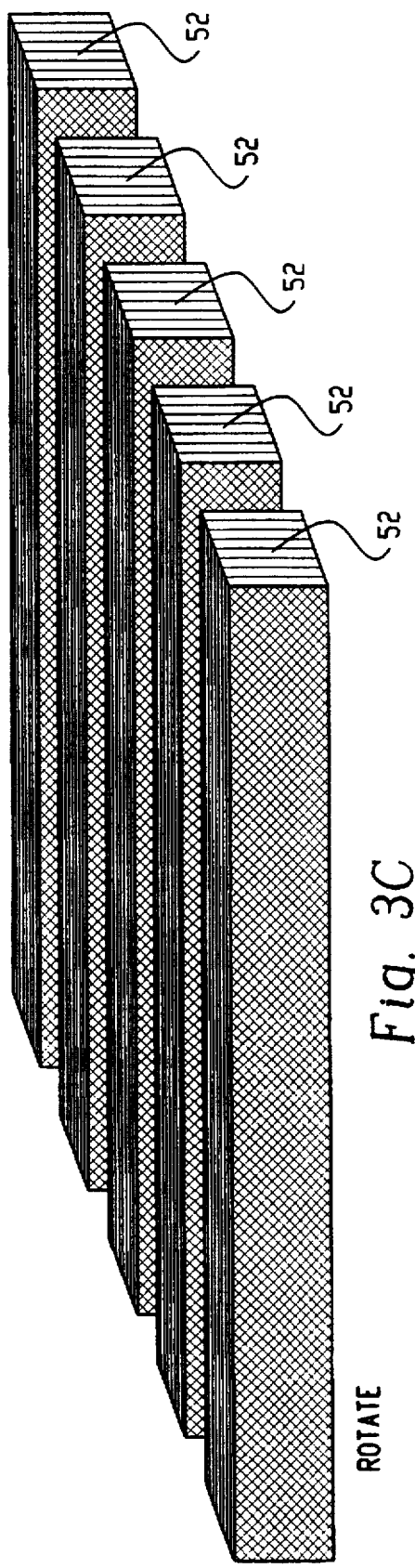
Figure 3D:
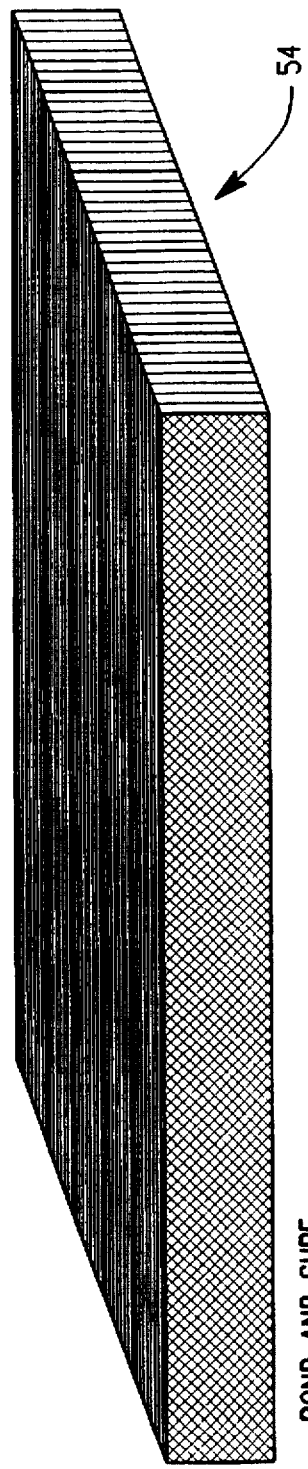
Figure 3E:
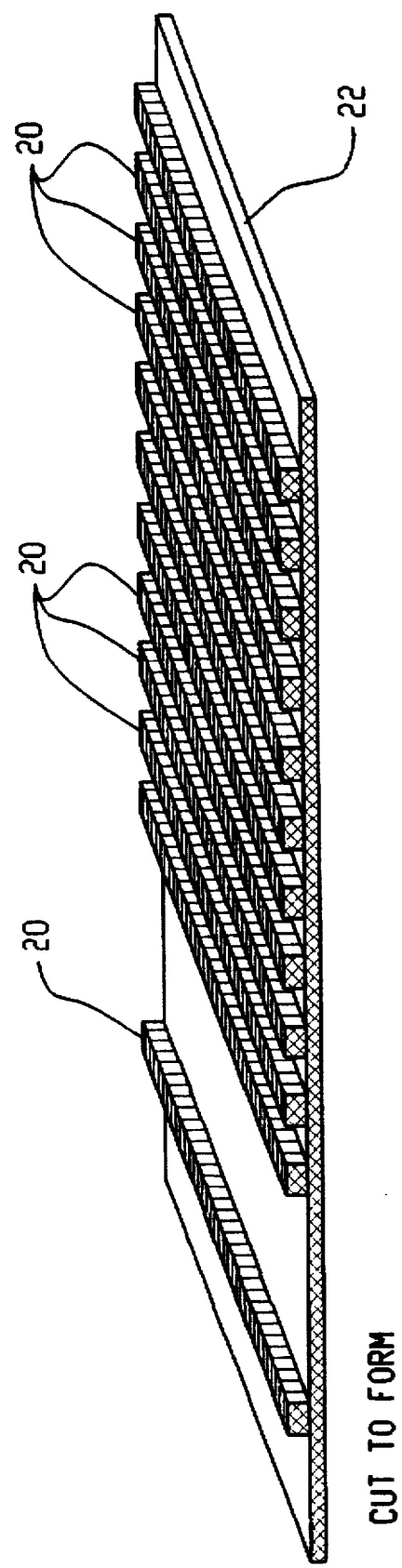
Figure 4:
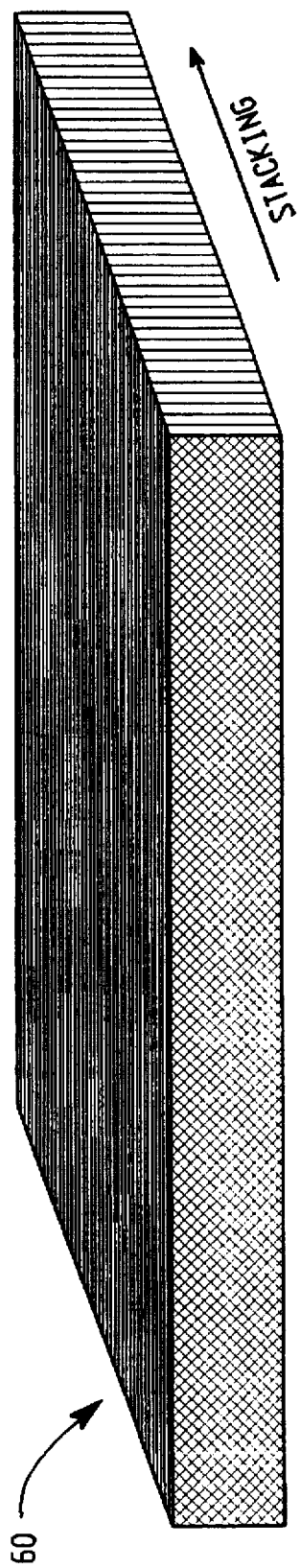
FIG. 4 illustrates part of another method for making a composite card guide according to the present invention.

In the step illustrated in FIG. 3B, the composite block is cut onto a plurality of segments 52 as illustrated. The cutting can be done in a conventional manner such as by diamond wheel cutting. Next, the segments are rotated as in FIG. 3C so that the cross-ply pattern now lies in the vertical planes. The rotated segments 52 are next bonded together and cured to secure the segments together to form a second block, as shown in FIG. 3D. Finally, the re-formed block 54 is cut by a suitable process such as described before, to form the guide ribs 20 integral with the cold wall. Thus, heat transfer can be facilitated away from the thermal plane of the circuit boards down to the cold wall and the attached heat exchanger 40 in an efficient manner.

The ribs 20 and cold wall 22 preferably are plated with a metal such as nickel by conventional process. The plating is only needed at the interfaces between the metal thermal planes T and the composite materials of the ribs and cold wall if they have the potential to develop galvanic corrosion. The plating also facilitates the attachment of the heat exchanger to the bottom of the cold wall in an efficient manner.

Different methods, of course, can be used to make the card guide. In FIG. 4, the laminates are stacked by hand layup such that the stacking is done in a horizontal plane and the cross-ply fiber orientation is initially in a vertical direction. The cured block 60 can then be machined to form the integral guide rib/coldwall structure. This alternative method thus saves the need to rotate and then bond the segments together and thus can be more cost effective.

The composite card guide can thus made as a unibodypart. For example, the composite block 60 shown in FIG. 4 is made with sufficient vertical height to provide both the cold wall and guide ribs. The block thus can be precision machined and plated to form a single piece card guide.

Figure 5:
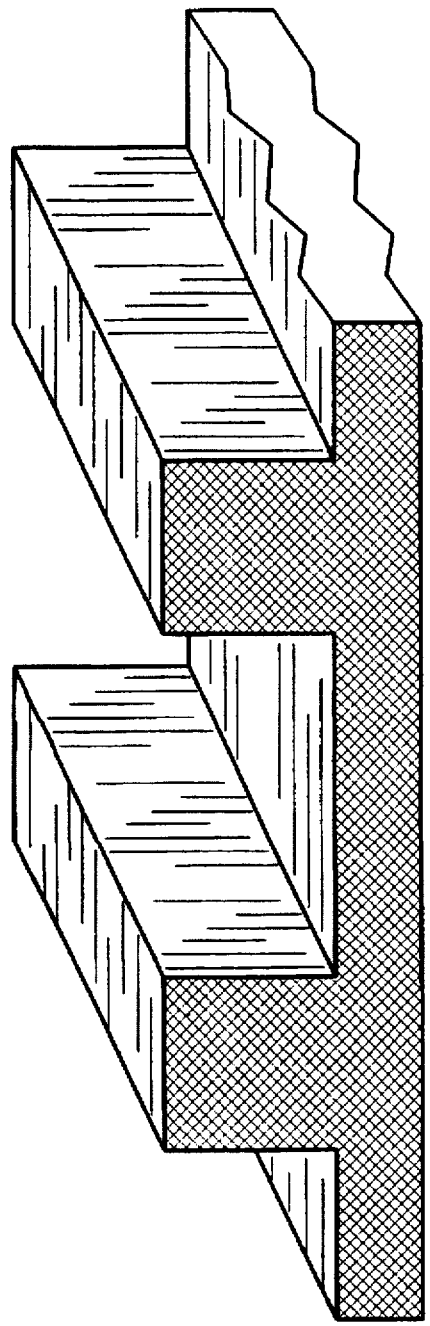
FIG. 5 is an illustration of a unibody composite card guide according to the invention.

In another alternative process for making the card guide, the heat treated fiber is braided to net shape (ribs and cold wall) prior to impregnating with the resin using a resin transfer molding (RTM) process. To obtain maximum performance from the fiber, a higher ratio of fibers is preferred (e.g., 2:1, 3:1) in the direction of the thermal plane, T, as previously described with reference to FIG. 2. The resultant card guide so produced can then be machined as needed to produce the desired final card guide configuration such as shown in FIG. 5.

While the invention has been shown and described with respect to specific embodiments thereof, this is for the purpose of illustration rather than limitation, and other variations and modifications of the specific embodiments herein shown and described will be apparent to those skilled in the art within the intended spirit and scope of the invention as set forth in the appended claims.

I claim:

1. A method for making a unibody enclosure for electronic modules comprising the steps of:
   a. laying up uncured carbon and resin layers in a mold;
   b. laying up additional uncured carbon and resin layers in the mold;
   c. performing a single step cure by applying heat and pressure to the materials in the mold to form said enclosure;
   d. laying up a plurality of carbon and resin laminates to form a first composite block and then curing said first composite block;
   e. cutting said block into a plurality of segments,
   f. joining said segments together to form a second block;
   g. cutting said second block to form a plurality of guide ribs integral with a cold wall; and
   h. mounting the finished cold wall and ribs in said enclosure.

2. The method of claim 1 wherein the step of joining said segments to form a second block includes the step of aligning said segments in a predetermined orientation to produce a preferred direction of heat transfer.

3. A method for making a unibody enclosure for electronic modules comprising the steps of:
   a. laying up a woven uncured carbon layer of conductive fibers and in a mold;
   b. applying an uncured resin layer over the first layer in the mold;
   c. laying up additional uncured carbon and resin layers in the mold;
   d. laying up an uncured glass and resin core in the mold;
   e. laying up additional uncured carbon and resin layers in the mold;
   f. performing a single step cure by applying heat and pressure to the materials in the mold to form said enclosure; and g. laying up a plurality of carbon and resin laminates to form a first composite block: then applying heat and pressure to cure the composite block;

h. cutting said block into a plurality of segments, i. aligning said segments in a predetermined orientation to produce a preferred direction of heat transfer;

j. joining said segments together to form a second block;

k. cutting said second block to form a plurality of guide ribs integral with a cold wall; said ribs and cold wall having a preferred direction of heat transfer;

l. bonding cooling fins to said cold wall; and m. mounting the finished cold wall and ribs in said enclosure.

4. The method of claim 3 wherein said glass and resin core comprises a glass bead epoxy syntactic.

5. The method of claim 3 wherein said core is formed using materials that provides an impedance mismatch with the carbon and resin layers for electromagnetic shielding.

6. The method of claim 3 wherein the step of laying up a plurality of carbon resin laminates to form a first composite block includes the step of forming said laminates with woven mesophase pitch based carbon fibers that are heat treated before the resin is applied to improve thermal conductivity of the fibers.

7. The method of claim 6 wherein said fibers used in said first composite block are woven in a cross-ply manner.

8. The method of claim 7 wherein said cross-ply weave includes an unbalanced orientation as to fibers oriented in one direction compared to fibers oriented in another direction preferred for heat transfer.

* * * * *